United States Patent
Sakata et al.

(10) Patent No.: US 11,232,245 B2
(45) Date of Patent: Jan. 25, 2022

(54) CIRCUIT GENERATION DEVICE AND SOFTWARE GENERATION DEVICE

(71) Applicant: HITACHI, LTD., Tokyo (JP)

(72) Inventors: Teruaki Sakata, Tokyo (JP); Teppei Hirotsu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 25 days.

(21) Appl. No.: 16/755,705

(22) PCT Filed: Mar. 5, 2018

(86) PCT No.: PCT/JP2018/008318
§ 371 (c)(1),
(2) Date: Apr. 13, 2020

(87) PCT Pub. No.: WO2019/171428
PCT Pub. Date: Sep. 12, 2019

(65) Prior Publication Data
US 2021/0200926 A1 Jul. 1, 2021

(51) Int. Cl.
*G06F 30/33* (2020.01)
*G06F 8/20* (2018.01)

(52) U.S. Cl.
CPC ............. *G06F 30/33* (2020.01); *G06F 8/20* (2013.01)

(58) Field of Classification Search
CPC ... G06F 30/33; G06F 8/20; G06F 8/00; G06F 30/3308; G06F 30/3315; G06F 30/00; G06F 30/10; G06F 30/01; G06F 2111/00
See application file for complete search history.

(56) References Cited

U.S. PATENT DOCUMENTS 8,166,427 B1 * 4/2012 Pathak .................... G06F 30/34
716/104
10,565,010 B2 * 2/2020 Matsuo ................ G06F 9/4881
(Continued)

FOREIGN PATENT DOCUMENTS

| JP | 2010-238054 A | 10/2010 |
| JP | 2014-016894 A | 1/2014 |
| WO | 2011/007640 A1 | 1/2011 |

OTHER PUBLICATIONS

International Search Report, PCT/JP2018/008318, dated Apr. 17, 2018, 1 pg.

*Primary Examiner* — Nha T Nguyen
(74) *Attorney, Agent, or Firm* — Volpe Koenig

(57) ABSTRACT

A circuit generation device that implements a standard function and a degeneration function has a first operation synthesis function of generating a circuit description based on a system operation description, there are provided a degenerate parameter extraction function of extracting a degenerate parameter from the operation description, a degeneration parameter change function of changing a value of the degeneration parameter, a second operation synthesis function of generating a degeneration circuit description based on the operation description and the degeneration parameter value, and a determination function of determining whether the performance of the degeneration circuit description satisfies a constraint condition based on the circuit description. When the determination function determines that the degeneration circuit description does not satisfy the constraint condition, the second operation synthesis function is executed after the value of the degeneration parameter is changed by the degeneration parameter change function.

7 Claims, 24 Drawing Sheets

(56) References Cited

U.S. PATENT DOCUMENTS

| | | | |
|---|---|---|---|
| 10,607,039 B1* | 3/2020 | Kinderman | G05B 17/02 |
| 2002/0176421 A1* | 11/2002 | Munemori | H04L 49/309 |
| | | | 370/395.1 |
| 2006/0010342 A1* | 1/2006 | Kanamaru | G06F 30/3323 |
| | | | 714/6.32 |
| 2008/0005725 A1* | 1/2008 | Reis | G06F 8/53 |
| | | | 717/146 |
| 2014/0019726 A1 | 1/2014 | Toi et al. | |
| 2017/0068764 A1* | 3/2017 | Takashina | G06F 30/34 |

* cited by examiner

FIG. 2

|  | STANDARD CIRCUIT | DEGENERATION CIRCUIT | UNIT |
|---|---|---|---|
| MHz | 100 | 85 | [%] |
| AREA | 100 | 50 | [%] |
| ACCURACY | 100 | 75 | [%] |

|  | STANDARD CIRCUIT | DEGENERATION CIRCUIT | UNIT |
|---|---|---|---|
| MHz | 1,000 | 850 | [MIPS] |
| AREA | 120,000 | 60,000 | [GATES] |
| ACCURACY | 100 | 75 | [%] |

```
1:  int64 accumulate(int32 a[4], int32 b[4]) {
2:      int64 c[4];
3:      int64 d;
4:      int32 i;
5:
6:      for (i=0; i<4; i++) {
7:          c[i] = a[i] * b[i];
8:      }
9:
10:     for (i=0; i<4; i++) {
11:         d += c[i];
12:     }
13:
14:     return(d);
15: }
```
450

FIG. 6

| Line | Category | Type | Name | Size |
|---|---|---|---|---|
| 1 | output | int64 | accumulate | 1 |
| 1 | input | int32 | a | 4 |
| 1 | input | int32 | b | 4 |
| 2 | variable | int64 | c | 4 |
| 3 | variable | int64 | d | 1 |
| 4 | variable | int32 | i | 1 |
| 6 | for loop | | | 4 |
| 10 | for loop | | | 4 |

```
1:   int32 accumulate(int16 a[4], int16 b[4]) {
2:       int32 c[4];
3:       int32 d;
4:       int3 i;
5:
6:       c[0] = a[0] * b[0];
7:       c[1] = a[1] * b[1];
8:       c[2] = a[2] * b[2];
9:       c[3] = a[3] * b[3];
10:
11:      for (i=0; i<4; i++) {
12:          d += c[i];
13:      }
14:
15:      return(d);
16:  }
```

```
1:   int64 accumulate(int32 a[4], int32 b[4]) {
2:       int64 c[4];
3:       int64 d;
4:       int32 i;
5:
6:       for (i=0; i<4; i++) {
7:           c[i] = a[i] * b[i];
8:       }
9:
10:      for (i=0; i<4; i++) {
11:          d += c[i];
12:      }
13:
14:      return(d);
15:  }
```
450

FIG. 21

```
1:   int64 accumulate_reliable(int, int) {
2:   #pragma HLS reliable accumulate;
3:   }
```
452

FIG. 22

```
1:   int64 accumulate(int32 a[4], int32 b[4]) {
2:       int64 c[4];
3:       int64 d;
4:       int32 i;
5:
6:       for (i=0; i<4; i++) {
7:           c[i] = a[i] * b[i];
8:       }
9:
10:      for (i=0; i<4; i++) {
11:          d += c[i];
12:      }
13:
14:      return(d);
15:  }
```

FIG. 23

```
1:   int64 accumulate_degenerate(int, int) {
2:   #pragma HLS degenerate accumulate;
3:   }
```

FIG. 24

```
1:   int64 accumulate_degenerate(int, int) {
2:   #pragma HLS degenerate accumulate MHz = 85, Area = 50, Accuracy = 75;
3:   }
```

| | STANDARD CIRCUIT | DEGENERATION CIRCUIT |
|---|---|---|
| MHz | 100 | 95 OR MORE |
| AREA | 100 | 80 OR LESS |
| ACCURACY | 100 | 75 OR MORE |

CIRCUIT GENERATION DEVICE AND SOFTWARE GENERATION DEVICE

TECHNICAL FIELD

The present invention relates to a circuit generation device and a software generation device.

BACKGROUND ART

With the miniaturization of semiconductor processes, the performance of central processing units (CPUs) has been improved, and high-speed and large-scale devices such as random access memory (RAMS) and field programmable gate arrays (FPGAs) have become possible.

With the advancement of these semiconductor devices, particularly in the industrial field and the automobile field, efforts for realizing various functions that could not be achieved conventionally have begun. For example, in the industrial field, efforts are being made on Internet of Things (IoT), which collects operation data from a large number of devices distributed and arranged in the real world, analyzes it in the virtual world, and feeds back better control output to the real world. In the automotive field, efforts are being made to incorporate Artificial Intelligence (AI) into the control device of the vehicle to provide the vehicle system with a recognition function and a control function to realize automatic driving.

In such an industrial system or an automobile system, when the functions are advanced and the system is complicated, an issue is to secure safety and reliability. In particular, in a system involving human life, it is not allowed a system in which human life is damaged, in which, when an abnormality or a failure occurs in a part of the system, the influence spreads to the entire system, and the control cannot be performed as expected.

Therefore, in such a system, it is necessary to establish a mechanism that can detect the occurrence of an abnormality or failure and take countermeasures. Generally, by multiplexing the system, a mechanism is adopted so that the entire system does not become fatal even if an abnormality or failure occurs in a part of the system.

However, multiplexing the systems from the viewpoint of safety and reliability increases the cost. For example, in a system in which mass productivity is regarded as important, such as an automobile, the increase in cost due to redundancy is not preferable. Therefore, it may be effective to implement a part that realizes a standard function and then implement a part that realizes a degeneration function that realizes a minimum function that ensures safety when an abnormality or failure occurs.

However, in such a case, in addition to the man-hours for creating the standard function, the man-hours for separately creating and verifying the degeneration function is required, which is a problem in terms of cost and design period.

As a background art of the present technical field, for example, PTL 1 discloses an example of an operation synthesis apparatus which includes a generation unit which, based on an operation level description and a constraint condition describing an operation of a circuit mounted on an integrated circuit, realizes an operation described in the operation level description and generates an intermediate level description expressing a circuit which satisfies the constraint condition, a specification unit which analyzes the intermediate level description generated by the generation unit to specify a loop structure of the intermediate level description, a determination unit which determines whether any intermediate level description having the same loop structure as the loop structure specified by the specification unit has been simulated, a measurement unit which simulates an operation of a circuit expressed by the intermediate level description generated by the generation unit when the determination unit determines that the simulation has been done, obtains the number of individual execution cycles required for executing each process described in the intermediate level description, and obtains the total number of execution cycles required for executing all the processes described in the intermediate level description, a storage unit which stores the number of individual execution cycles obtained by the measurement unit and the loop structure specified by the specification unit in association with each other, and a calculation unit which obtains the total number of execution cycles of the intermediate level description generated by the generation unit based on the number of individual execution cycles which is stored in the storage unit in association with the same loop structure as that specified by the specification unit when the determination unit determines that the simulation has ended.

CITATION LIST

Patent Literature

PTL 1: WO 2011/007640 A

SUMMARY OF INVENTION

Technical Problem

By the way, as a result of the inventor's investigation on a conventional operation synthesis device that specifies an intermediate-level loop structure from an operation description, the following has become clear.

In the example of PTL 1, it is described as a feature that a loop structure is extracted from an operation description and a synthesis constraint for optimizing an execution cycle performance of a loop portion is searched for. However, there is no mention of the content that automatically extracts the degeneration function from the original operation description, and it is difficult to utilize the technology in order to cope with increase in the number of steps when the degeneration function is created in addition to the standard function, which is the subject of the invention.

The invention has been made in view of the above problems, and an object of the invention is to provide a circuit generation device and a software generation device that can implement a standard function and a degeneration function at low cost and early in a system such as an industrial field or an automobile field.

Solution to Problem

In order to achieve the above object, the invention provides a circuit generation device or software generation device, which has a first operation synthesis function of generating a circuit description or a software description based on an operation description of a system. There are provided a degeneration parameter extraction function of extracting a degeneration parameter from the operation description, a degeneration parameter change function of changing a value of the degeneration parameter, a second operation synthesis function of generating a degeneration circuit description or a degeneration software description based on the operation description and the value of the degeneration parameter, and a determination function of determining whether performance of the degeneration circuit description or the degeneration software description satisfies a constraint condition based on the circuit description or the software description. If the determination function determines that the degeneration circuit description or the software description does not satisfy the constraint condition, the degenerate parameter change function changes the value of the degenerate parameter and then executes the second operation synthesis function.

Advantageous Effects of Invention

According to this invention, it is possible to mount a standard function and a degeneration function at low cost and early in the system of an industrial field, an automobile field, etc.

BRIEF DESCRIPTION OF DRAWINGS

FIG. 2 is a diagram illustrating an example of a constraint condition in the flow of FIG. 1.

FIG. 3 is a diagram illustrating another example of a constraint condition in the flow of FIG. 1.

FIG. 4 is a diagram illustrating an example of an operation description in the flow of FIG. 1.

FIG. 6 is a diagram illustrating a list of parameters extracted by the flow in FIG. 4.

FIG. 8 is a diagram illustrating an example of an operation description changed by the flow in FIG. 7.

FIG. 20 is the same operation description as that illustrated in FIG. 4.

FIG. 21 is a diagram illustrating an example of an operation description using a high reliability type pragma with respect to the operation description illustrated in FIG. 20.

FIG. 22 is the same operation description as that illustrated in FIG. 4.

FIG. 23 illustrates an example of an operation description using a degeneration type pragma with respect to the operation description illustrated in FIG. 22.

FIG. 24 illustrates another example of an operation description using a degeneration type pragma with respect to the operation description illustrated in FIG. 22.

DESCRIPTION OF EMBODIMENTS

Hereinafter, embodiments of the invention will be described using the drawings. In the following description, a circuit that implements standard functions during normal operation of the system is called a standard circuit, its design description is called a standard circuit description, software that realizes standard functions is called standard software, and its design description is called a standard software description. A circuit that realizes the degeneration function when an error or failure occurs in the system is called a degeneration circuit, its design description is called a degeneration circuit description, software that realizes the degeneration function is called a degeneration software, and its design description is called a degeneration software description.

First Embodiment

A first embodiment of the invention will be described using FIGS. 1 to 11.

Figure 1:
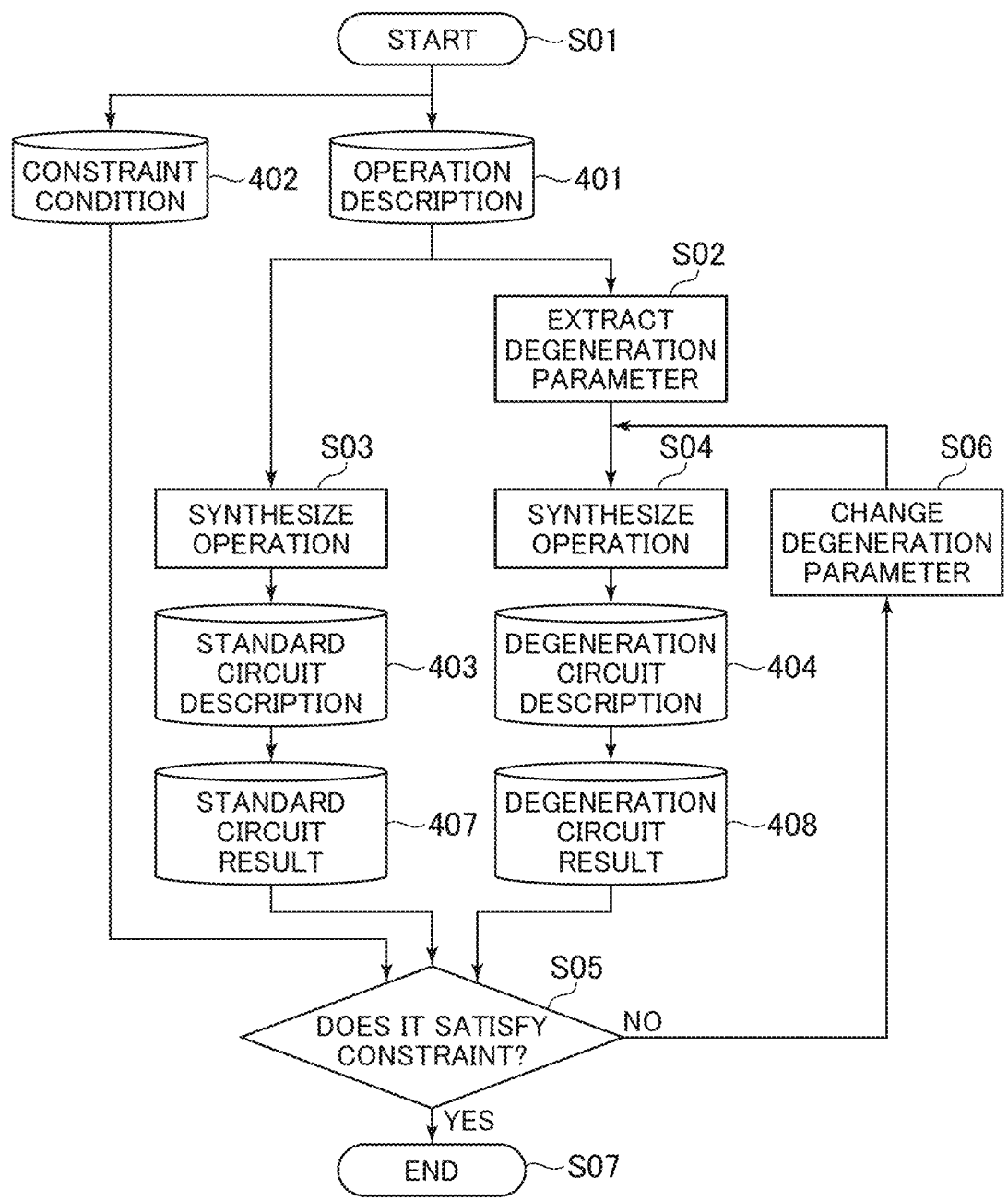
FIG. 1 is a flowchart illustrating an example of an operation of a circuit generation device according to a first embodiment of the invention.

FIG. 1 is a flowchart illustrating an example of the operation of the circuit generation device in this embodiment.

Starting from Step S01, a designer prepares an operation description 401 of the system to be mounted and a constraint condition 402 as a guide for the degeneration circuit to be mounted.

By an operation synthesis in Step S03, a standard circuit description 403 and a standard circuit result 407 are output from the operation description 401.

On the other hand, the operation description 401 outputs a degeneration circuit description 404 and a degeneration circuit result 408 by the operation synthesis in Step S04 through the degeneration parameter extraction in Step S02.

The degeneration circuit description 404 and a degeneration circuit result 408 obtained by the flow of the circuit generation device of FIG. 1 are evaluated in Step S05 as to whether they are within the allowable range of the constraint condition 402 on a standard circuit description 403 and a standard circuit result 407. As a result, when the constraint is satisfied, the process proceeds to Step S07 to end the operation flow. However, when the constraint is not satisfied, the process proceeds to Step S06 to change the degeneration parameter, and the flow from Step S04 to Step S05 is repeated.

FIG. 2 illustrates an example of the constraint condition 402 in the flow of FIG. 1.

FIG. 2 illustrates that the operation speed of the standard circuit (MHz), the circuit area (Area), and the accuracy (Accuracy) are each set to 100, and these are expressed in a ratio such that the operation speed of the degeneration circuit is 85% of the standard circuit, the circuit area is 50%, and the accuracy is 75%.

On the other hand, FIG. 3 illustrates the operation speed, area, and accuracy of the degeneration circuit as absolute values with respect to the absolute values of the operation speed, circuit area, and accuracy of the standard circuit, and each item are set with different units. As described above, the constraint condition of the degeneration circuit can be set in various formats. The format for setting the constraint condition of the degeneration circuit may be a table format, a text format, a comma-separated format, or the like.

FIG. 4 illustrates an example of the operation description 401 in the flow of FIG. 1.

In the notation of an operation description 450 illustrated in FIG. 4, int32 indicates that it is a 32-bit signed integer type. Similarly, int64 indicates a 64-bit signed integer type.

The first line of the operation description 450 defines a 64-bit function accumulate. This function takes as input the variables a and b, each of which has a 32-bit array size of 4.

The second line of the operation description 450 defines a variable c of 64 bits and having an array size of 4 that is used locally in the function accumulate.

The third and fourth lines of the operation description 450 define a 64-bit variable d and a 32-bit variable i that are used locally in the function accumulate.

The sixth to eighth lines of the operation description 450 describe a for-loop statement that repeats four times between 0 and less than 4 in the value of the local variable i. The seventh line describes a process of substituting the product of the array a and the array b for the array c.

The tenth to twelfth lines of the operation description 450 describe another for-loop statement that repeats four times between 0 and less than 4 in the value of the local variable i. The eleventh line describes the process of adding the value of the array c to the local variable d.

The fourteenth line of the operation description 450 describes a process of outputting the value of the variable d obtained in the process of the function accumulate and ending the process.

Figure 5:
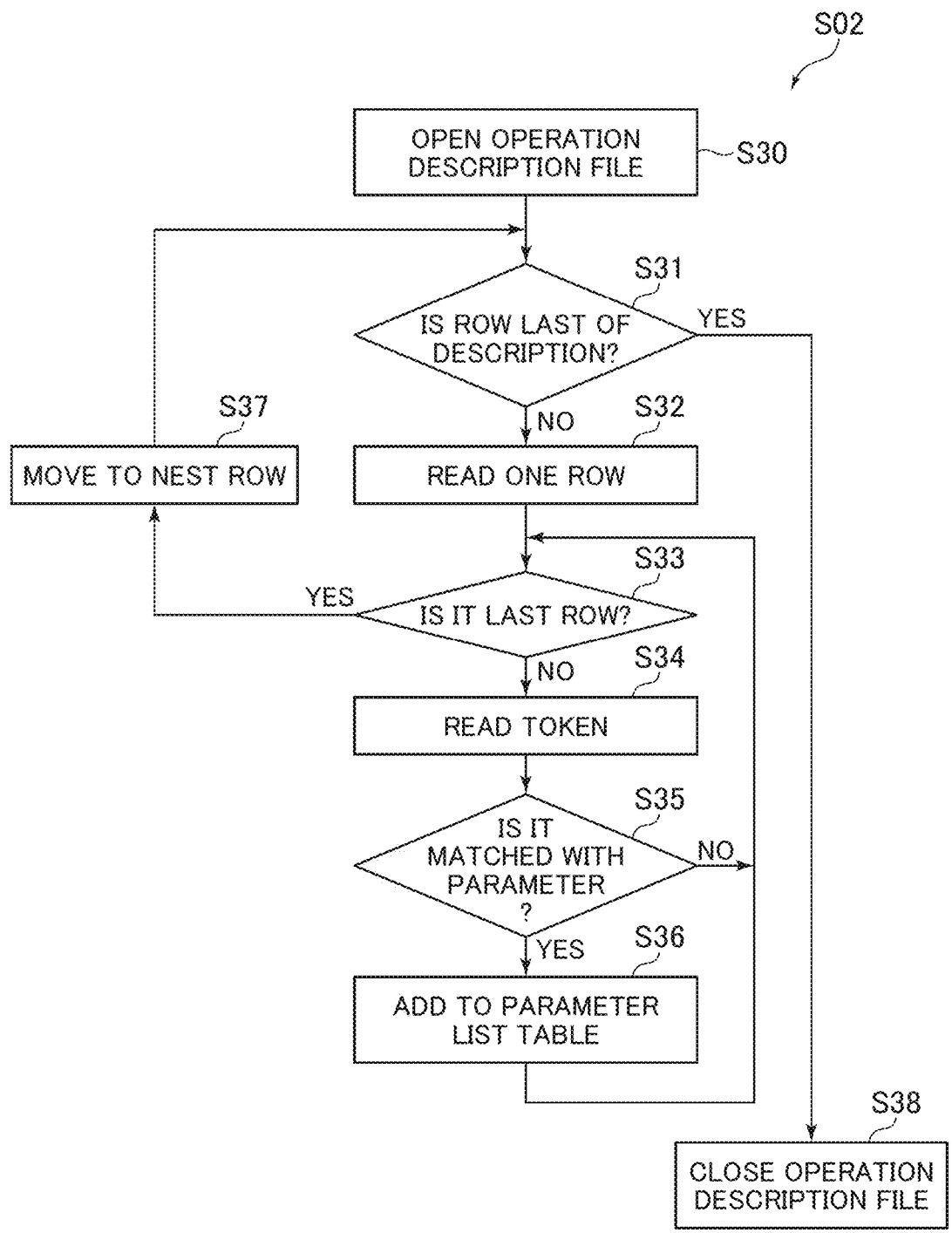
FIG. 5 is a flowchart illustrating details of a step for extracting a degeneration parameter in the flow of FIG. 1.

FIG. 5 illustrates details of a step (Step S02) of extracting a degeneration parameter in the flow of FIG. 1.

In Step S30, an operation description file is opened.

If the description of the operation description file opened in Step S31 is the last, the operation ends and the process proceeds to Step S38 to close the operation description file. If the description is not the last, the process proceeds to Step S32 and reads one line of the operation description.

If the one description line read in Step S33 is the end of the line, the process proceeds to Step S37 to check the next line. If the line is not the last, a token is read in Step S34.

If the token read in Step S35 does not match a predetermined parameter, the process proceeds to Step S33 to check the next line, but if the token matches the parameter, it is added to a parameter list in Step S36. The process proceeds to Step S33 to check whether there is a next token in the operation description. In this way, the flow of FIG. 5 is repeated until the end of the operation description.

FIG. 6 illustrates an example of the parameter list created in Step S36 in FIG. 5.

Each column of a parameter list table 462 represents a line number (Line), a classification (Category), a type (Type), a name (Name), and a size (Size) in order from the left.

This parameter list table 462 corresponds to the operation description 450 illustrated in FIG. 4, and the first line (Line=1) of the operation description 450 indicates that the function name accumulate (Name=accumulate) of a 64-bit type (Type=int64) to be output (Category=output) is size 1 (Size=1), and these are extracted from the operation description 450 by the degeneration parameter extraction in Step S02.

Similarly, the parameter list table 462 indicates that, in the first line (Line=1) of the operation description 450, the variable name a (Name=a) of a 32-bit type (Type=int32) to be input (Category=input) is array size 4 (Size=4), which are also extracted from the operation description 450 by extracting the degeneration parameters in Step S02. Hereinafter, the same applies to other rows of the parameter list table 462.

Figure 7:
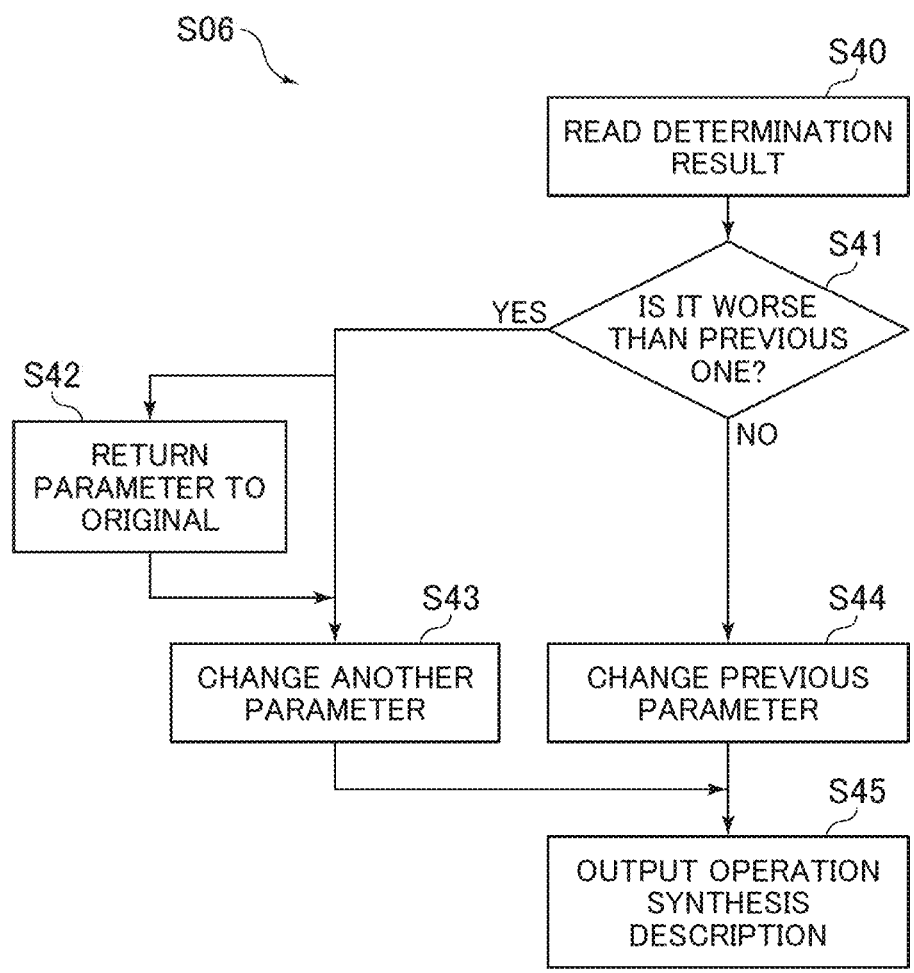
FIG. 7 is a flowchart illustrating details of a step for changing a degeneration parameter in the flow of FIG. 1.

FIG. 7 illustrates the details of the step for changing the degeneration parameters (Step S06) in the flow of FIG. 1.

In Step S40, a determination result indicating how much the degeneration circuit deviates from the constraint condition based on the standard circuit is read.

As a result of reading the determination result, if it is not worse than the previous determination result in Step S41, the process proceeds to Step S44 to change the previous parameter. If the result is worse than the previous determination result, the process proceeds to Step S42 to return the parameter value to the original value and proceeds to Step S43 to change another parameter value, or proceeds to Step S43 instead of Step S42 to change the value of another parameter.

When the parameter change is completed, the changed content is output to the operation synthesis description in Step S45.

FIG. 8 illustrates an example of the operation description changed by the flow of FIG. 7.

In the notation of the operation description 451 illustrated in FIG. 8, int16 indicates that it is a 16-bit signed integer type. Similarly, int3 indicates a 3-bit signed integer type.

The operation description 451 in FIG. 8 is different from the operation description 450 illustrated in FIG. 4 in that the place that is int64 on the first line is int32, the place that is int32 is int16, and the place that is int64 on the second line is int32, the part that is int64 on the third line is int32, the part that is int32 on the fourth line is int3, and the part that is a for-loop statement from the sixth line to the eighth line is the part composed of sequential processing statements from the sixth line to ninth line.

Figure 9:
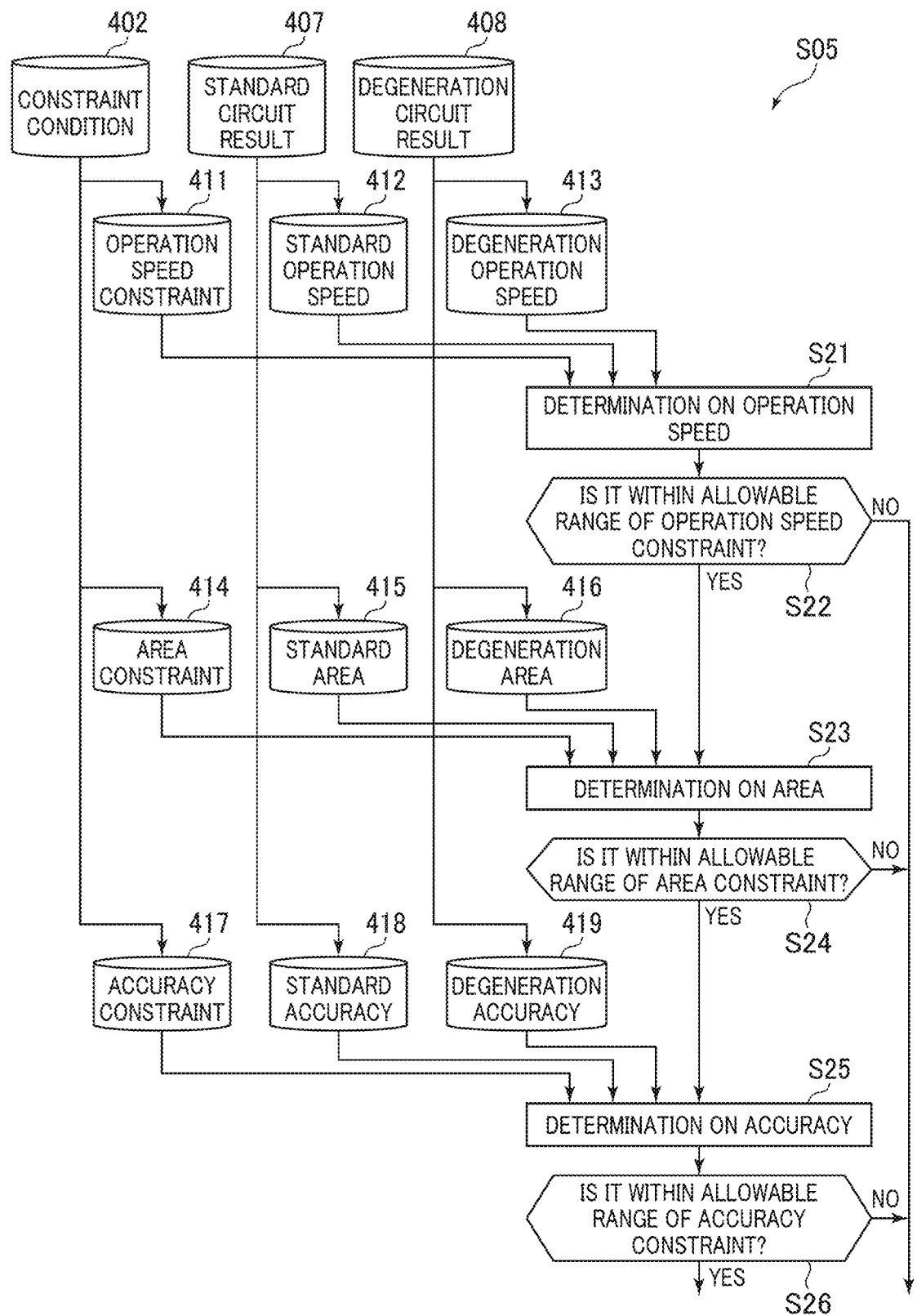
FIG. 9 is a flowchart illustrating details of a step for determining whether a degeneration circuit result satisfies a constraint condition based on a standard circuit result in the flow of FIG. 1.

FIG. 9 illustrates details of the step (Step S05) of determining whether the degeneration circuit result satisfies the constraint condition based on the standard circuit result in the flow of FIG. 1.

In the example of the flow of FIG. 9, the constraint condition 402 includes an operation speed constraint 411, an area constraint 414, and an accuracy constraint 417.

The standard circuit result 407 includes a standard performance 412, a standard area 415, and a standard accuracy 418.

The degeneration circuit result 408 includes a degeneration performance 413, a degeneration area 416, and a degeneration accuracy 419.

In the example of the flow of FIG. 9, first, in Step S21, it is determined how much the degeneration performance deviates from the allowable range of the standard performance from the operation speed constraint 411, the standard performance 412, and the degeneration performance 413, and if it is determined in Step S22 that the operation speed is not within the allowable range of the operation speed constraint 411, the flow ends and the process returns to circuit generation again.

In Step S23, it is determined how much the degeneration area deviates from the allowable range of the standard area from the area constraint 414, the standard area 415, and the degeneration area 416, and if it is determined in Step S24 that the area is not within the allowable range of the area constraint 414, the flow ends and the process returns to circuit generation again.

In Step S25, it is determined how much the degeneration accuracy deviates from the allowable range of the standard accuracy from the accuracy constraint 417, the standard accuracy 418, and the degeneration accuracy 419, and if it is determined in Step S26 that the accuracy is not within the allowable range of the accuracy constraint 417, the flow ends and the process returns to circuit generation again.

If it is within the allowable range of the constraint condition in any of steps S22, S24, and S26, the degeneration circuit description and the degeneration circuit result at this time are used, and the flow ends.

FIG. 9 illustrates an example in which the determination is performed in the order of the operation speed, the area, and the accuracy, but the determination order is not limited thereto.

Figure 10:
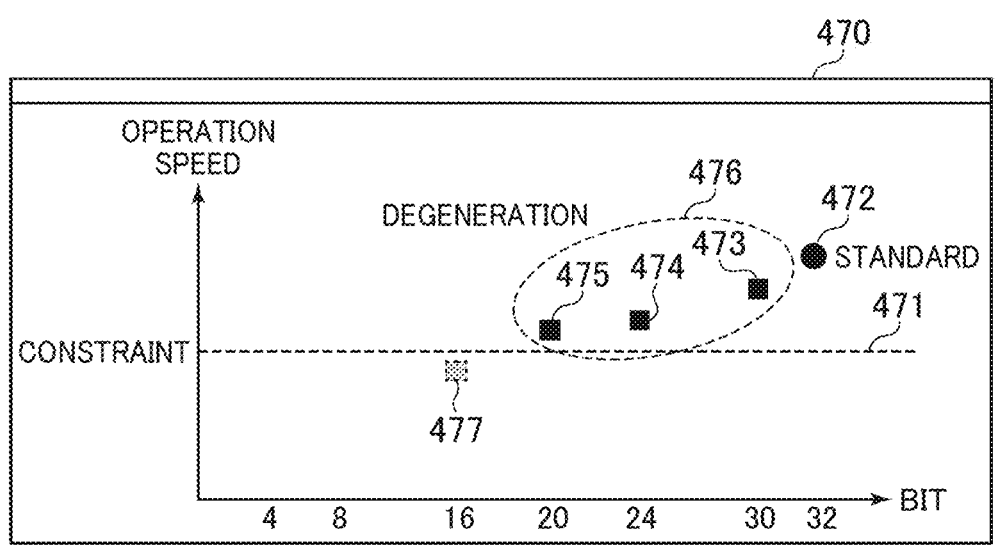
FIG. 10 is a diagram illustrating an example of a graphical user interface (GUI) displayed on a display device of the circuit generation device according to the first embodiment of the invention.

FIG. 10 illustrates an example of a graphical user interface (GUI) displayed on a display device 291 (illustrated in FIG. 11) of the circuit generation device in this embodiment.

A window 470 in FIG. 10 displays information on the standard circuit, the degeneration circuit, and the constraint conditions in the circuit generation device.

In the graph illustrated in the example of the window 470, the horizontal axis indicates a bit width and the vertical axis indicates an operation speed, and a constraint line 471 is provided in the middle of the operation speed axis.

A standard result 472 of the operation speed of the standard circuit in 32 bits obtained by the circuit generation device is plotted on the graph.

On the other hand, a degeneration result 473 of the operation speed of the degeneration circuit when reduced to 30 bits is displayed on the graph. Similarly, a degeneration result 474 of the operation speed of the degeneration circuit when reduced to 24 bits, a degeneration result 475 of the operation speed of the degeneration circuit when reduced to 20 bits are displayed, and the degeneration results 473, 474, and 475 are collectively referred to as a degeneration result list 476.

In the example of this window 470, the degeneration circuits in the range where the bit width is reduced to 30 bits, 24 bits, and 20 bits are all above the constraint line 471, but if the degeneration circuit is configured by the next 16 bits, a degeneration prediction 477 is below the constraint line 471.

Further, although the example of FIG. 10 illustrates an example in which the relationship between the bit width and the operation speed is displayed on the GUI, the content is not limited to this, and the relationship with other parameters or constraints may be displayed on the GUI.

Figure 11:
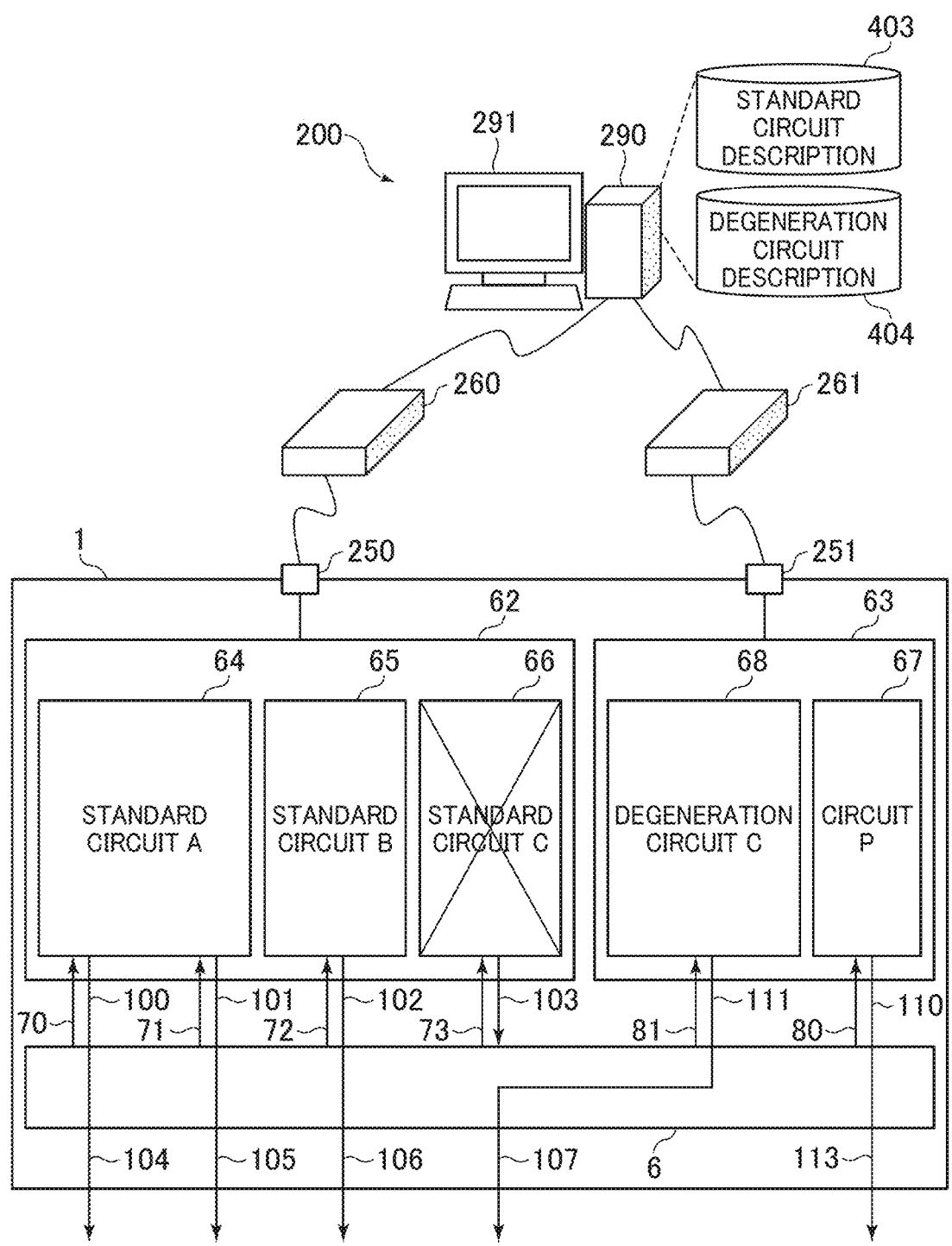
FIG. 11 is a diagram illustrating an example in which the circuit generation device according to the first embodiment of the invention is applied to a control system development environment.

FIG. 11 illustrates an example in which the circuit generation device in this embodiment is applied to a control system development environment. A computer 290 and the display device 291 in FIG. 11 form a circuit generation device 200 in this embodiment. Memory writers 260 and 261 are connected to the computer 290, and the memory writers 260 and 261 are connected to a control system 1 via ports 250 and 251 respectively.

In the example of FIG. 11, a standard circuit C (66) is obtained by writing the standard circuit description 403 generated by the circuit generation device 200 to the control system. 1 from the memory writer 260, and a degeneration circuit C (68) is obtained by writing the degeneration circuit description 404 generated by the circuit generation device 200 to the control system 1 from the memory writer 261.

Further, in the control system 1 of FIG. 11, an example in which an error occurs in the standard circuit C (66) in an FPGA (62) and the standard circuit C (66) cannot operate.

A control output 103 from the standard circuit C (66) where the error has occurred, and thus a degeneration circuit C (63) corresponding to the standard circuit C (66) is enabled by switching control signals 81 and 80 from a system control unit 6.

At this time, the control output 103 from the standard circuit C (66) where the error has occurred is not output to the outside of the control system 1 as a control output 107, but a control output 111 of the degeneration circuit C (68) is output as the control output 107.

As described above, in the circuit generation device 200 in this embodiment, the standard function and the degeneration function can be implemented at low cost in the control system 1 in which the standard function and the degeneration function are realized by hardware.

In addition, since the display device 291 allows the designer to check the realization degree of the degeneration function with respect to the standard function one by one using the GUI, if the degeneration function is likely to have unintended performance, the design can be changed in advance, and it is possible to reduce design man-hours for mounting the degeneration function.

Second Embodiment

A second embodiment of the invention will be described using FIGS. 12 and 13.

In the first embodiment, the circuit generation device that generates hardware (circuit description) that realizes the standard function and hardware (degeneration circuit description) that realizes the degeneration function from a single operation description has been described. However, the standard function and the degeneration function may be implemented by software. In this embodiment, a software generation device that generates a software description (standard software description) that realizes the standard function and a software description (degeneration software description) that realizes the degeneration function from a single operation description will be described.

Figure 12:
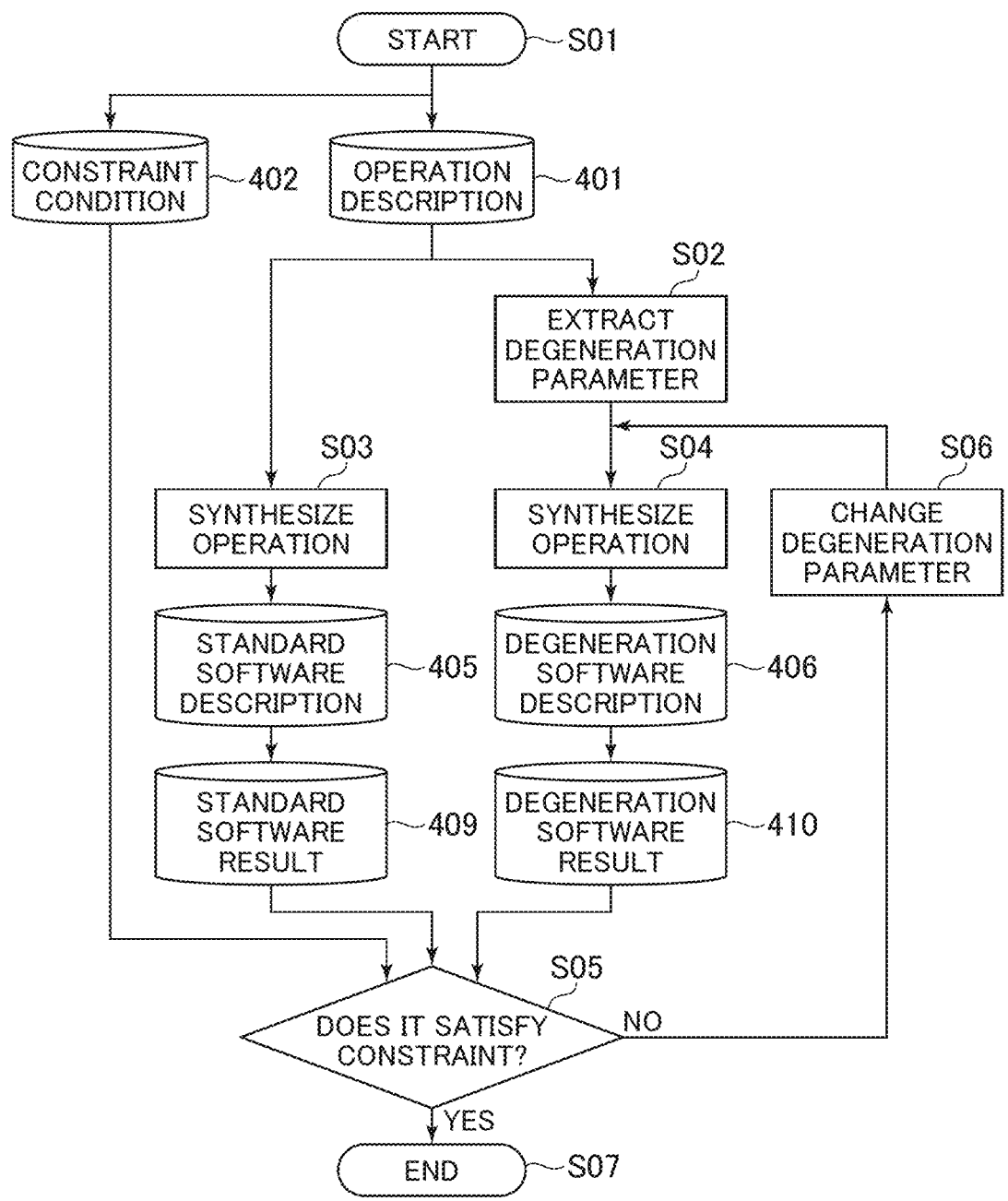
FIG. 12 is a flowchart illustrating an example of an operation of the software generation device according to a second embodiment of the invention.

FIG. 12 illustrates an example of an operation flow of the software generation device in this embodiment. The circuit generation device in this embodiment is different from the operation flow (illustrated in FIG. 1) in the first embodiment in that the function of generating the standard circuit description is replaced with a function of generating the standard software description, and the function of generating the degeneration circuit description is replaced with a function of generating the degeneration software description.

Figure 13:
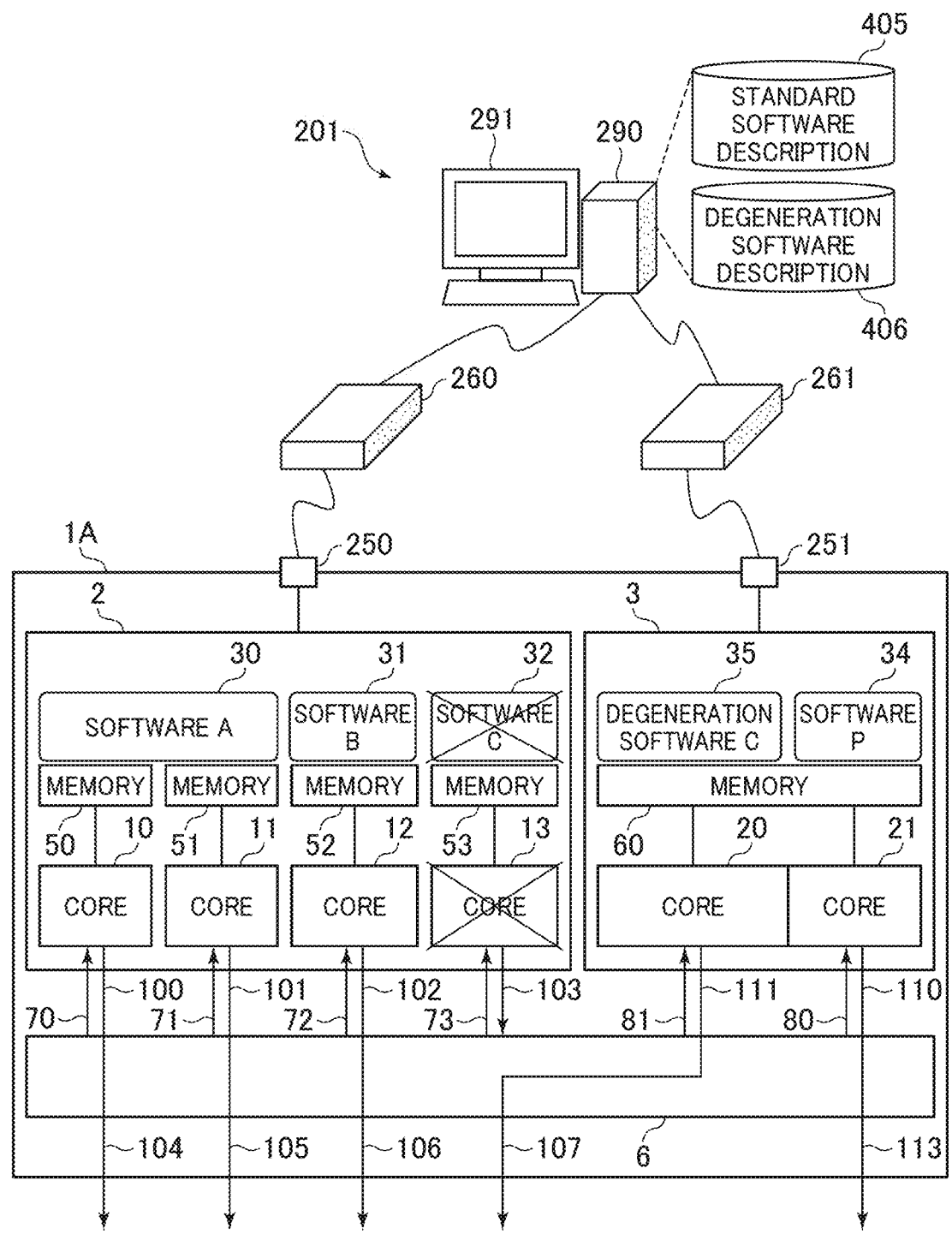
FIG. 13 is a diagram illustrating an example of a case where the software generation device according to the second embodiment of the invention is applied to a control system development environment.

FIG. 13 illustrates an example in which the software generation device in this embodiment is applied to a control system development environment. FIG. 13 is different from the first embodiment (illustrated in FIG. 11) in that the standard circuit description has been changed to the standard software description, the degeneration circuit description has been changed to the degeneration software description, the FPGA (62) has been changed to a multi-core system, and the FPGA (63) has been changed to a lock-step core system. The computer 290 and the display device 291 in FIG. 13 form a software generation device 201 in this embodiment.

In a control system 1A, four cores 10, 11, 12, and 13 adopt a multi-core configuration.

The core 10 is connected to a memory 50 and performs processing by arranging software of the core 10 in the memory 50. Similarly, the core 11 is connected to a memory 51, the core 12 is connected to a memory 52, and the core 13 is connected to a memory 53, and the software is arranged and performs processing.

In the example of FIG. 13, a software A (30) is arranged in the memories 50 and 51, and the cores 10 and 11 perform multi-core operation. On the other hand, a software B (31) is arranged only in the memory 52 and operates on the core 12, and similarly, a software C (32) is arranged only on the memory 53 and operates on the core 13.

These cores 10, 11, 12, and 13, memories 50, 51, 52, and 53, the software A (30), the software B (31), and the software C (32) are collectively referred to as a multi-core system 2.

The cores 20 and 21 of the control system 1A form a lock-step (Lock-Step, LS). That is, the cores 20 and 21 share a memory 60, and the core 21 operates a software P (34).

The cores 20 and 21, the memory 60, and the software P (34) are collectively referred to as a lock-step core system 3 here.

Further, the system control unit 6 illustrated in FIG. 13 receives a control output 100 from the core 10, a control output 101 from the core 11, a control output 102 from the core 12, a control output 103 from the core 13, a control output 111 from the core 20, and a control output 110 from a core 21, and outputs a reset signal 70 for the core 10, a reset signal 71 for the core 11, a reset signal 72 for the core 12, a reset signal 73 for the core 13, a switching control signal 81 for the core 20, and a switching control signal 80 for the core 21, and also outputs the control outputs 104, 105, 106, 107, and 113 to the outside of the control system 1A.

In the example of FIG. 13, a standard software description 405 generated by the software generation device 201 is written from the memory writer 260 to the control system 1A as the software C (32), and a degeneration software description 406 generated by the software generation device 201 in this embodiment is written from the memory writer 261 to the control system 1A as a degeneration software C (35).

Further, in the control system 1A of FIG. 13, an example is illustrated in which an error has occurred in the core 13 in the multi-core system 2 and the software C (32) has become inoperable.

By the control output 103 from the core 13 where the error has occurred, the cores 20 and 21 are switched from a lock-step operation mode to a multi-core operation mode by the switching control signals 81 and 80 from the system control unit 6, and the degeneration software C (35) corresponding to the software C (32) is arranged in the memory 60.

At this time, the control output 103 from the core 13 in which the error has occurred is not output to the outside of the control system 1A as the control output 107, and the control output 111 of the core 20 in which the degeneration software C (35) is operating is output as the control output 107.

As described above, in the software generation device 201 in this embodiment, the standard function and the degeneration function can be implemented at low cost in the control system 1A in which the standard function and the degeneration function are realized by software.

Third Embodiment

A third embodiment of the invention will be described using FIGS. 14 and 15.

Figure 14:
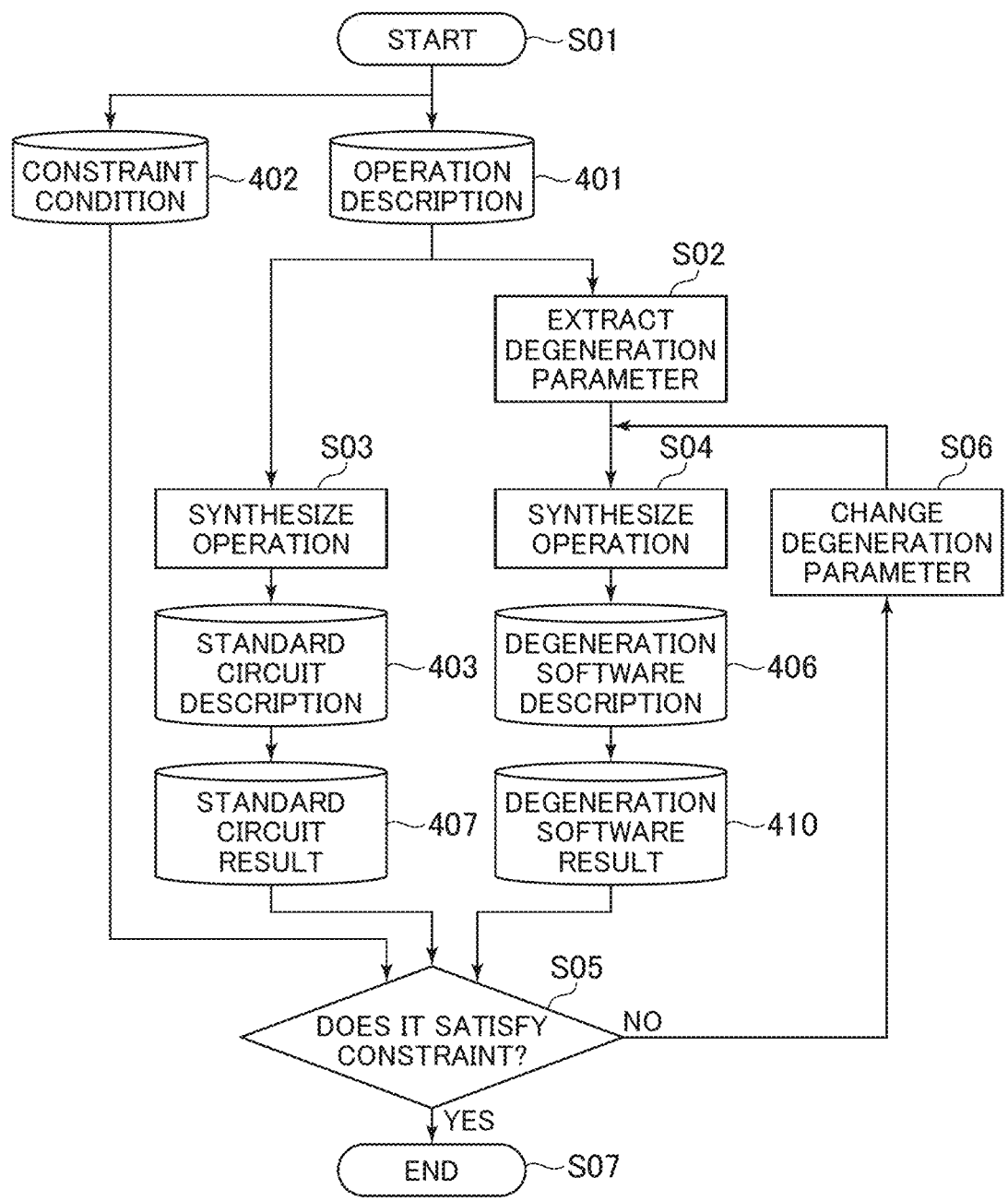
FIG. 14 is a flowchart illustrating an example of an operation of the circuit generation device according to a third embodiment of the invention.

FIG. 14 illustrates an example of an operation flow of the circuit generation device in this embodiment. The circuit generation device in this embodiment differs from the circuit generation device according to the first embodiment (illustrated in FIG. 1) in that the function of generating the degeneration circuit description is replaced with a function of generating a degeneration software description.

Figure 15:
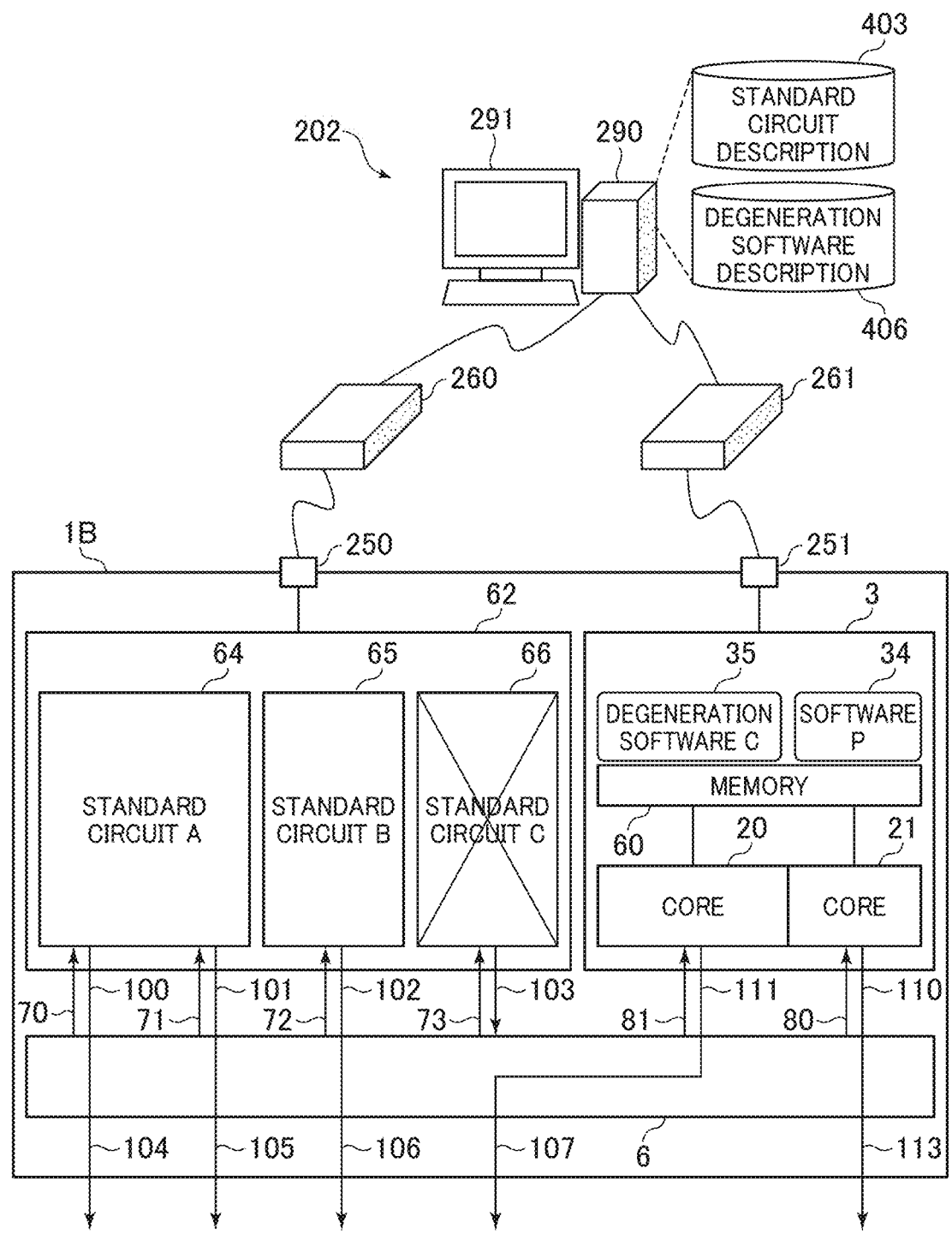
FIG. 15 is a diagram illustrating an example of a case where the circuit generation device according to the third embodiment of the invention is applied to a control system development environment.

FIG. 15 illustrates an example in which the circuit generation device in this embodiment is applied to a control system development environment. FIG. 15 is different from the first embodiment (illustrated in FIG. 11) in that the degeneration circuit description is changed to the degeneration software description and the FPGA (63) is changed to the lock-step core system. The computer 290 and the display device 291 in FIG. 13 form a circuit generation device 202 in this embodiment.

The FPGA (62) of a control system 1B includes a standard circuit A (64), a standard circuit B (65), and a standard circuit C (66).

In the example of FIG. 15, the standard circuit description 403 generated by the circuit generation device 202 is written from the memory writer 260 to the control system 1B as the standard circuit C (66), and the degeneration software description 406 generated by the circuit generation device 202 in this embodiment is written from the memory writer 261 to the control system 1B as the degeneration software C (35).

Further, in the control system 1B of FIG. 15, an example is illustrated in which an error has occurred in the standard circuit C (66) in the FPGA (62) and the standard circuit C (66) has become inoperable.

By the control output 103 from the standard circuit C (66) where the error has occurred, the cores 20 and 21 are switched from a lock-step operation mode to a multi-core operation mode by the switching control signals 81 and 80 from the system control unit 6, and the degeneration software C (35) corresponding to the standard circuit C (66) is arranged in the memory 60.

At this time, the control output 103 from the standard circuit C (66) in which the error has occurred is not output to the outside of the control system 1B as the control output 107, and the control output 111 of the core 20 in which the degeneration software C (35) is operating is output as the control output 107.

As described above, in the circuit generation device 202 in this embodiment, the standard function and the degeneration function can be implemented at low cost in the control system 1B in which the standard function is realized by hardware and the degeneration function are realized by software. In other words, since the standard function and the degeneration function of the system can be implemented regardless of hardware and software, the standard function and the degeneration function can be implemented at low cost even to a board with a combination of an FPGA and a microcontroller or a device with a 1-chip FPGA and CPU.

Fourth Embodiment

A fourth embodiment of the invention will be described using FIGS. 16 and 17.

Figure 16:
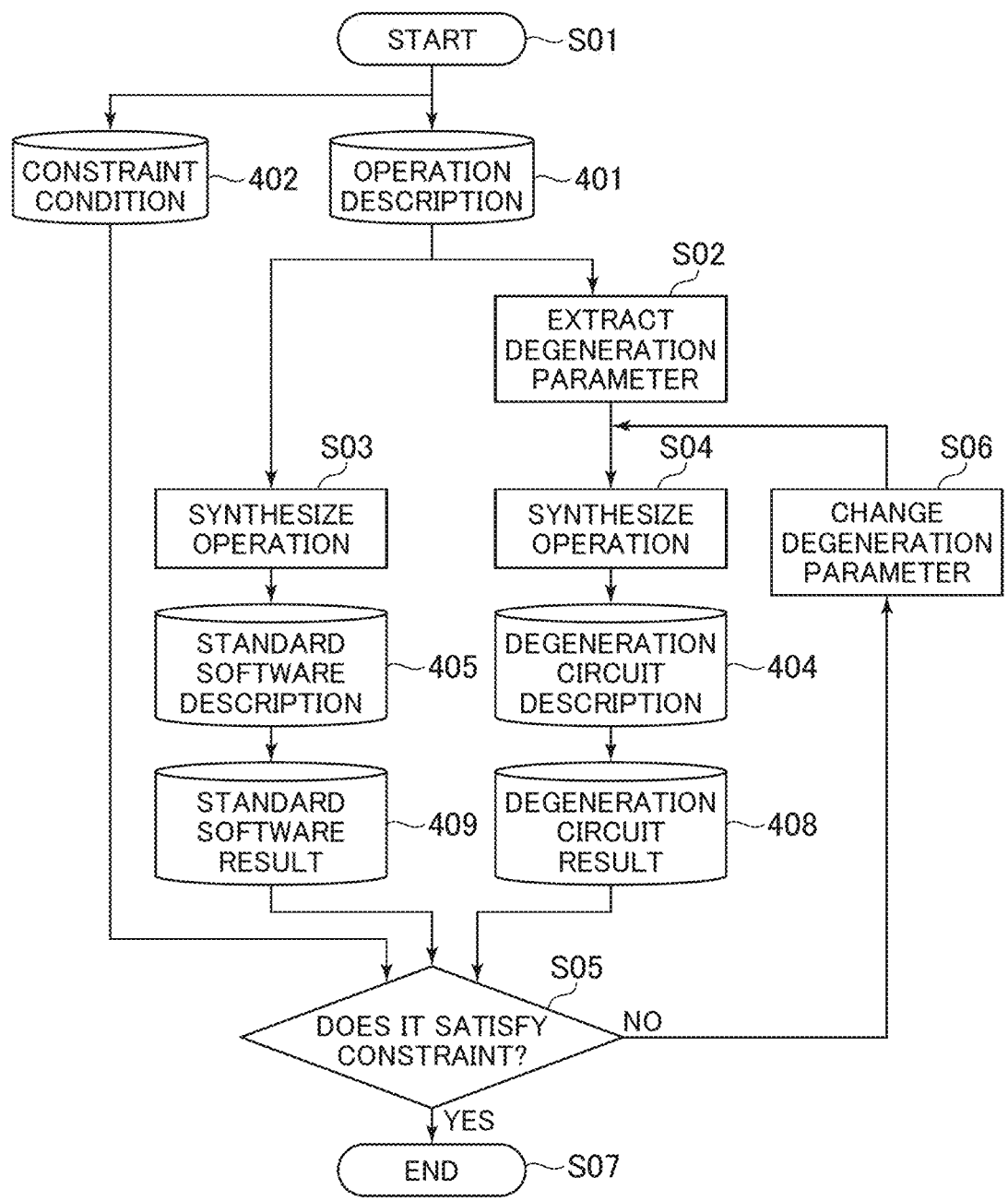
FIG. 16 is a flowchart illustrating an example of an operation of the software generation device according to a fourth embodiment of the invention.

FIG. 16 illustrates an example of an operation flow of the software generation device in this embodiment. The software generation device in this embodiment is different from the software generation device in the second embodiment in that the function of generating the degeneration software description is replaced with a function of generating the degeneration circuit description.

Figure 17:
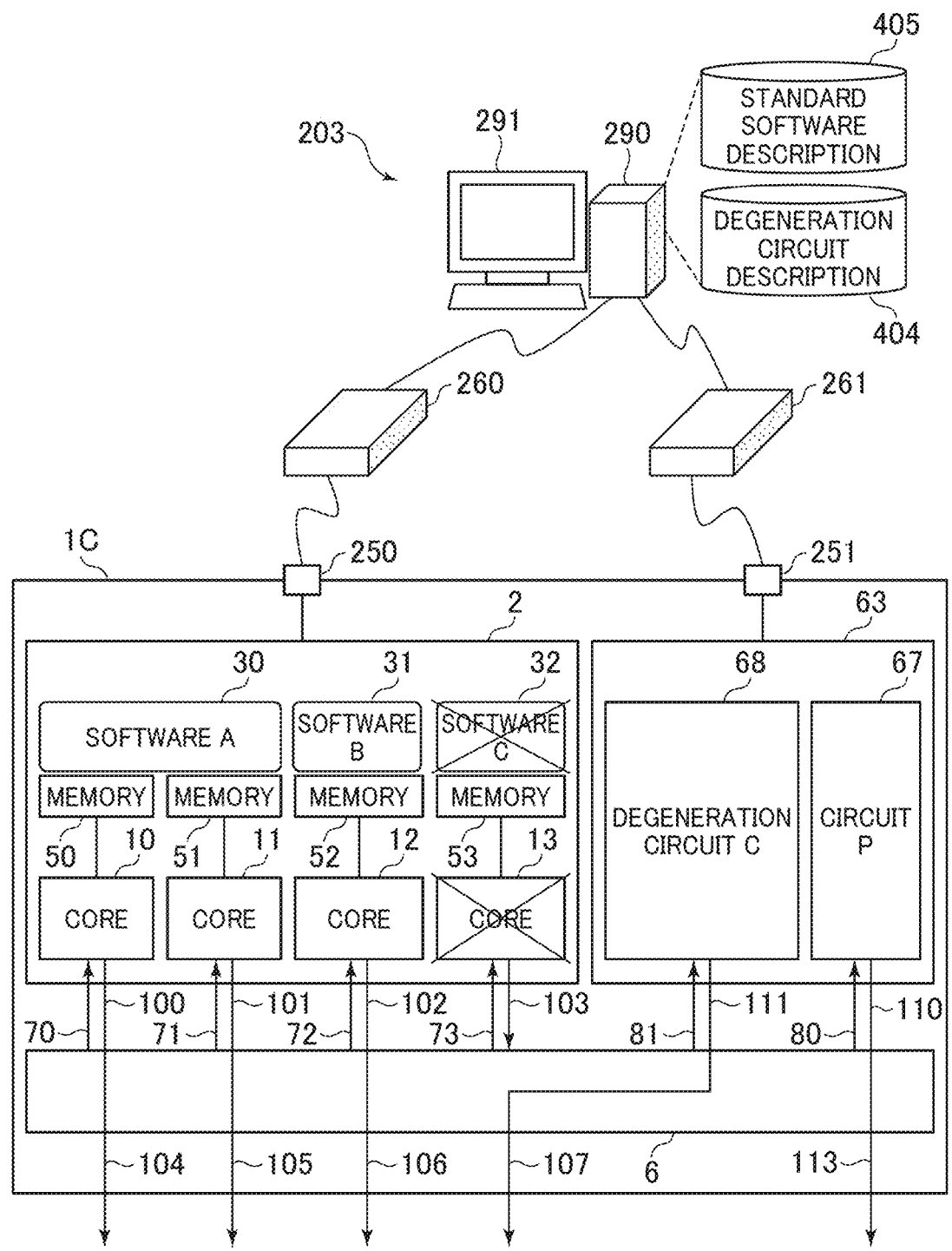
FIG. 17 is a diagram illustrating an example of a case where the software generation device according to the fourth embodiment of the invention is applied to a control system development environment.

FIG. 17 illustrates an example in which the software generation device in this embodiment is applied to a control system development environment. FIG. 17 is different from the second embodiment (illustrated in FIG. 13) in that the degeneration software description is changed to the degeneration circuit description and the lock-step core system is changed to the FPGA. The computer 290 and the display device 291 in FIG. 17 form a software generation device 203 in this embodiment.

The FPGA (63) of a control system 1C includes a circuit P (67) and a degeneration circuit C (68).

In the example of FIG. 17, a standard software description 405 generated by the software generation device 203 is written from the memory writer 260 to the control system 1C as the software C (32), and the degeneration circuit description 404 generated by the software generation device 203 in this embodiment is written from the memory writer 261 to the control system 1C as the degeneration circuit C (68).

Further, in the control system 1C of FIG. 11, an example is illustrated in which an error has occurred in the core 13 in the multi-core system 2 and the software C (32) has become inoperable.

A control output 103 from the core 13 where the error has occurred, and thus a degeneration circuit C (68) corresponding to the software C (32) is enabled by switching control signals 81 and 80 from a system control unit 6.

At this time, the control output 103 from the core 13 where the error has occurred is not output to the outside of the control system 1C as a control output 107, but a control output 111 of the degeneration circuit C (68) is output as the control output 107.

As described above, in the software generation device 203 in this embodiment, the standard function and the degeneration function can be implemented at low cost in the control system 1C in which the standard function is realized by software and the degeneration function are realized by hardware. In other words, the standard function and the degeneration function can be implemented at low cost even to a board with a combination of an FPGA and a microcontroller or a device with a 1-chip FPGA and CPU.

Fifth Embodiment

A fifth embodiment of the invention will be described using FIGS. 18 to 24.

Figure 18:
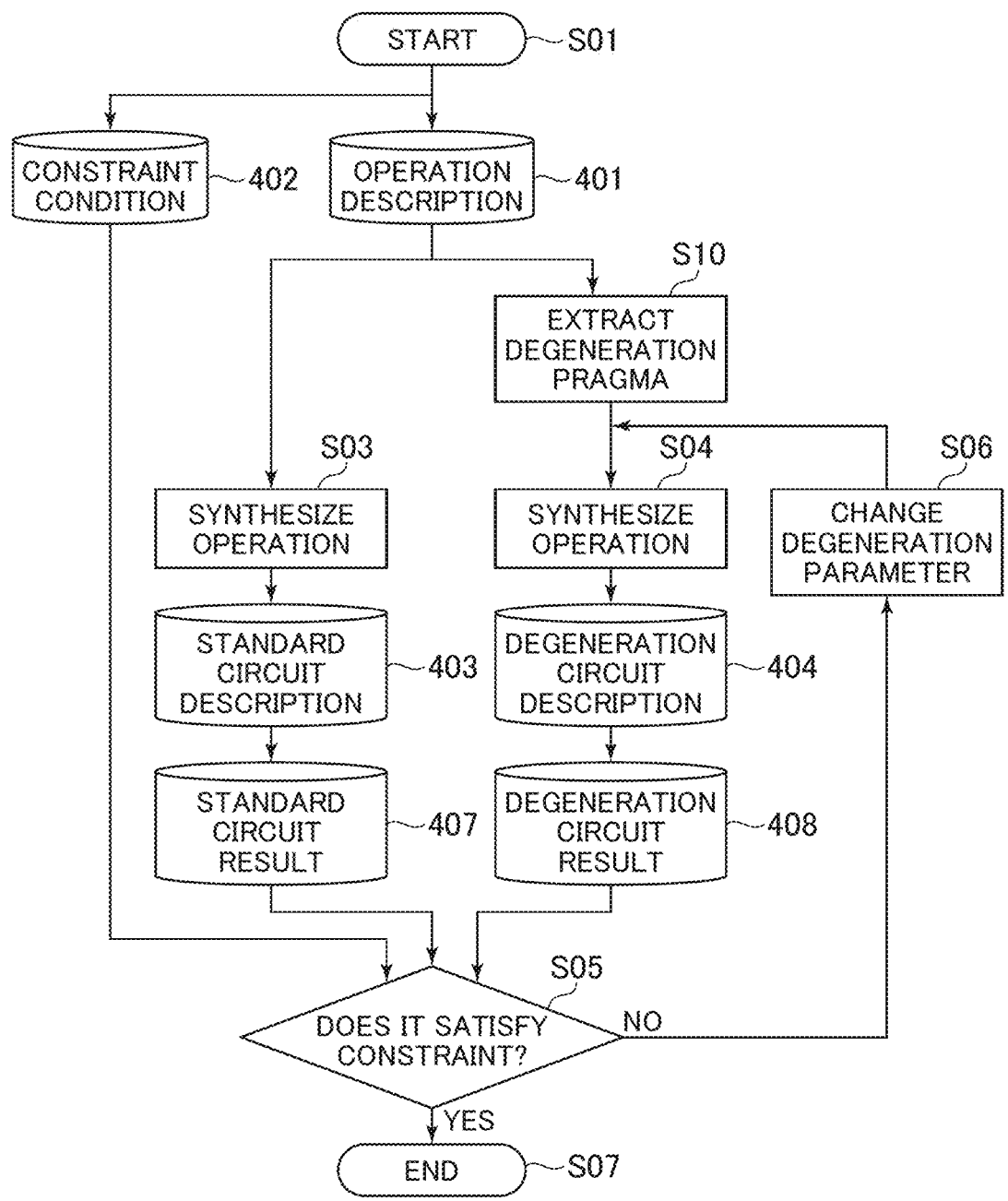
FIG. 18 is a flowchart illustrating an example of the operation of the circuit generation device according to a fifth embodiment of the invention.

FIG. 18 illustrates an example of an operation flow of the circuit generation device in this embodiment, and is different from the operation flow (illustrated in FIG. 1) in the first embodiment in that the flow for extracting the degeneration pragmas in Steps S02 and S10 is different.

Figure 19:
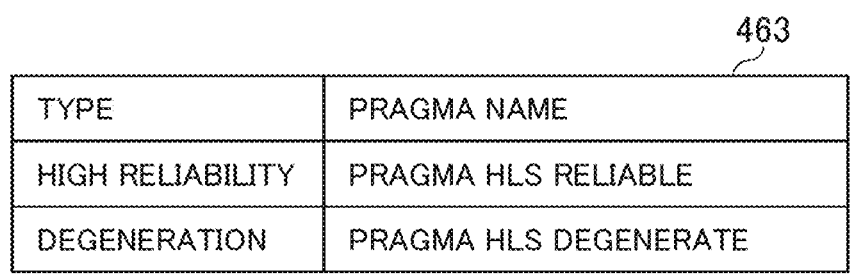
FIG. 19 is a diagram illustrating a list of pragmas used in the circuit generation device according to the fifth embodiment of the invention.

In order to execute the degeneration pragma extraction in Step S10, the circuit generation device of this embodiment uses, for example, a pragma as illustrated in FIG. 19.

A pragma list table 463 illustrated in FIG. 19 includes two examples of pragmas tagged with a type and a pragma name. The type is highly reliable and the pragma name is "pragma HLS reliable", and the type is degenerate and the pragma name is "pragma HLS degenerate".

The operation description 450 in FIG. 20 is the same as the operation description 450 described in FIG. 4, but an example of the operation description described using a high reliability type pragma for the operation description 450 is FIG. 21.

The operation description 452 of FIG. 21 describes the function name "accumulate_reliable" related to the function name "accumulate" on the first line of the operation description 450 on the first line, and the second line describes #pragma HLS reliable accumulate which is the pragma name of a highly reliable type and the original function name. A circuit in which the function name "accumurate" defined in the operation description 450 is highly reliable can be synthesized by the operation description 452 alone.

The operation description 450 in FIG. 22 is also the same as the operation description 450 described in FIG. 4, but an example of the operation description described using a degeneration type pragma for the operation description 450 is FIG. 23.

The operation description 453 of FIG. 23 describes the function name "accumulate_degenerate" related to the function name "accumulate" on the first line of the operation description 450 on the first line, and the second line describes #pragma HLS degenerate accumulate which is the pragma name of a degeneration type and the original function name. A circuit in which the function name "accumurate" defined in the operation description 450 is degenerated can be synthesized by the operation description 453 alone. As illustrated in FIG. 24, the constraint condition (operation speed, area, accuracy) of the degeneration circuit may be specified by the argument of the pragma whose type is degeneration.

As described above, in the circuit generation device in this embodiment, by preparing a dedicated pragma for generating a circuit, a designer can explicitly design a highly reliable circuit, a degeneration circuit, and the like.

Sixth Embodiment

A sixth embodiment of the invention will be described using FIG. 25.

Figure 25:
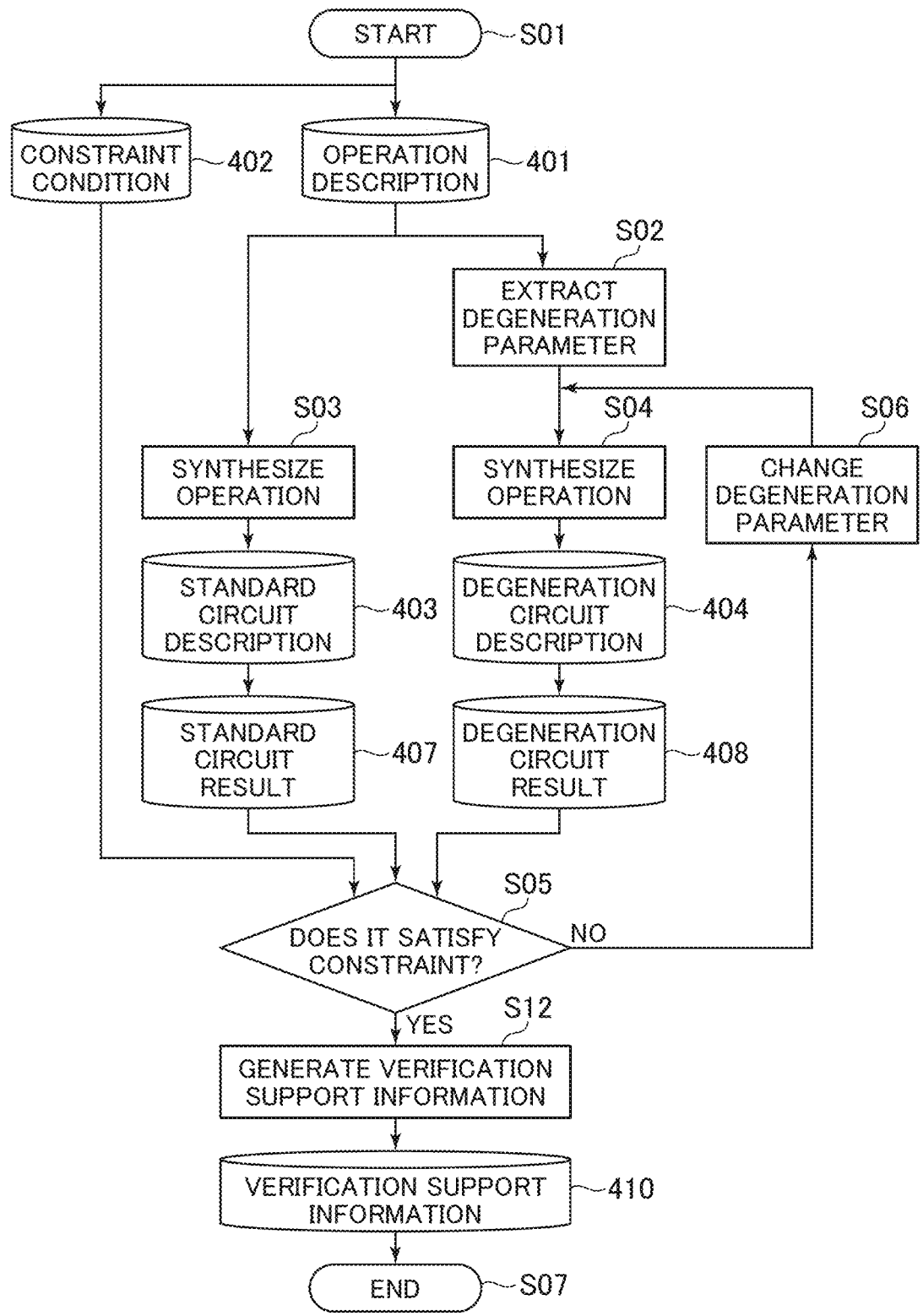
FIG. 25 is a flowchart illustrating an example of the operation of the circuit generation device according to a sixth embodiment of the invention.

FIG. 25 illustrates an example of an operation flow of the circuit generation device in this embodiment, and is different from the operation flow (illustrated FIG. 1) in the first embodiment in that apart for generating verification support information is added at the end of the flow.

After a degeneration circuit that satisfies the constraint condition is generated in Step S05, verification support information is generated in Step S12, and verification support information 410 is output.

The verification support information 410 is text file format information used to determine by simulation whether the function of the degeneration circuit description 404 is compatible or valid with the function of the standard circuit description 403, and used as input to simulation tools.

As described above, in the circuit generation device in this embodiment, by generating the verification support information, the designer can easily design the degeneration circuit and reduce the design man-hours when designing a highly reliable system. Further, the function of generating the verification support information described in this embodiment can be similarly implemented in the software generation device.

Seventh Embodiment

A seventh embodiment of the invention will be described using FIGS. 26 and 27.

Figures 26, 27:
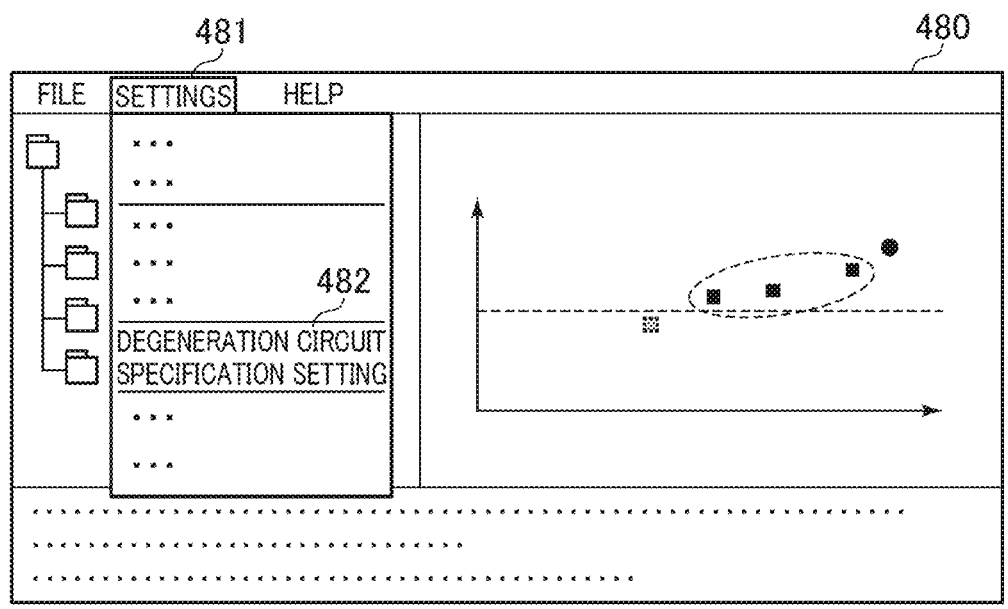
FIG. 26 is a diagram illustrating an example of a GUI displayed on a display device of the circuit generation device according to the first embodiment of the invention.
FIG. 27 is a diagram illustrating an example of a GUI displayed on a display device of the circuit generation device according to the first embodiment of the invention.

FIGS. 26 and 27 illustrate an example in which the circuit generation device 200 (illustrated in FIG. 11) in the first embodiment is applied to a system design tool.

A window 480 illustrated in FIG. 26 is an example of a GUI of a design tool used in circuit design. The window 480 and a window 490 described later are displayed on the display device 291 (illustrated in FIG. 1) of the circuit generation device 200.

Clicking a menu button 481 at the top of the window 480 opens a menu window 482, which has a menu for degeneration circuit specification settings.

When the menu for setting the degeneration circuit is clicked, the window 490 as illustrated in FIG. 27 is opened, which is an example of a GUI used for setting the specifications of the degeneration circuit.

In the example of this window 490, the operation speed, area, and accuracy of the standard circuit are all set to 100, and these are set such that the operation speed of the degeneration circuit is set to 95 or more, the area is set to 80 or less, and the accuracy is set to 75 or more.

As described above, by applying the circuit generation device 200 to a development tool in a system design, the designer can easily design a degeneration circuit and reduce design man-hours when designing a highly reliable system.

Eighth Embodiment

An eighth embodiment of the invention will be described using FIG. 28.

Figure 28:
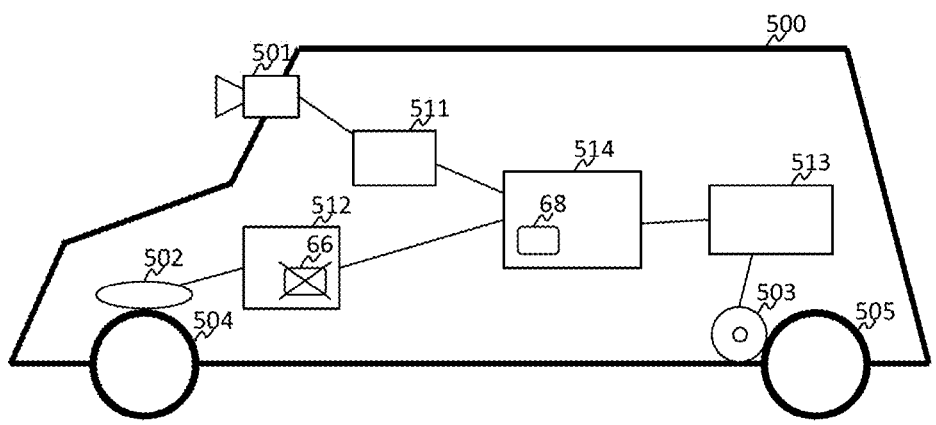
FIG. 28 is a diagram illustrating an example of a case where the standard circuit and the degeneration circuit generated by the circuit generation device according to the first embodiment of the invention are mounted on an in-vehicle system.

FIG. 28 illustrates an example in which the standard circuit and the degeneration circuit generated by the circuit generation device 200 (illustrated in FIG. 11) in the first embodiment are mounted on an in-vehicle system.

The inside of the vehicle 500 is configured by connecting a plurality of electronic control units (ECUs).

In this vehicle 500, a camera 501 is connected to a camera ECU (511), a steer 502 is connected to a steer ECU (512), a motor 503 is connected to a motor ECU (513). Further, the camera ECU (511), the steer ECU (512), and the motor ECU (513) are connected to an integrated ECU (514), and perform control as an automobile by performing cooperative operations.

In this configuration, for example, when an error occurs in the steer ECU (512), the degeneration circuit C (68) in the integrated ECU (514) is operated instead of the standard circuit C (66) in the steer ECU (512). As a result, a minimum operation previously performed by the steer ECU (512) is continued, and the rotation of a front wheel 504 and a rear wheel 505 is continued or stopped according to the surrounding conditions, thereby ensuring the safe operation of the entire vehicle 500.

As described above, by applying the circuit generation device 200 to an in-vehicle system, even if an error occurs in a part of an ECU of the vehicle, a system that maintains safety while performing degeneration operation as a whole vehicle can be easily realized at low cost.

Ninth Embodiment

A ninth embodiment of the invention will be described using FIG. 29.

Figure 29:
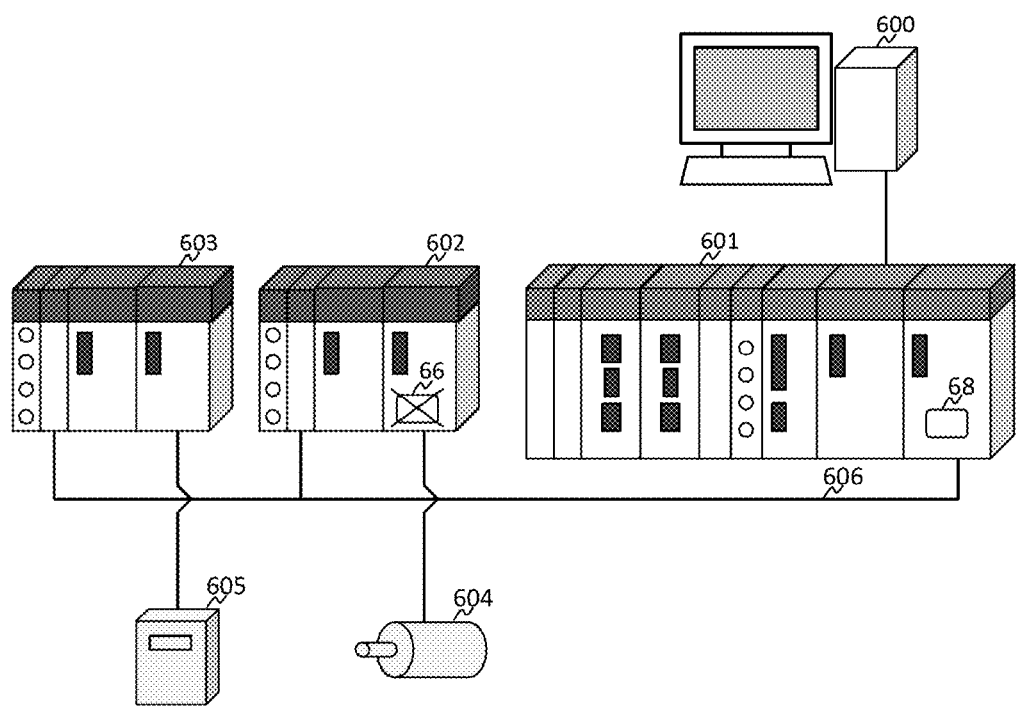
FIG. 29 is a diagram illustrating an example of a case where the standard circuit and the degeneration circuit generated by the circuit generation device according to the first embodiment of the invention are mounted on an industrial control system.

FIG. 29 illustrates an example in which the standard circuit and the degeneration circuit generated by the circuit generation device 200 (illustrated in FIG. 11) in the first embodiment are mounted on an industrial control system.

This industrial control system is configured by a computer 600 that controls the entire system, a controller 601 controlled by the computer 600, a programmable logic controller 602 that controls the control device 604, and a programmable logic controller 603 that controls the control device 605. The controller 601 and the programmable logic controllers 602 and 603 are connected to each other via a control network 606.

In this configuration, for example, when an error occurs in the programmable logic controller 602, the degeneration circuit C (68) is operated by the controller 601 via the control network 606 instead of the standard circuit C (66) which is operated by the programmable logic controller 602. Therefore, a minimum operation performed by the programmable logic controller 602 is continued, and the operation of the control device 604 is continued and safe, thereby ensuring the safe operation of the entire industrial control system.

As described above, by applying the circuit generation device 200 to an industrial control system, even if an error occurs in apart of the controllers of the industrial control system, a system that maintains safety while performing degeneration operation as a whole system can be easily realized at low cost.

Note that the invention is not limited to the embodiments described above, but includes various modifications. For example, the above embodiments have been described in detail for easy understanding of the invention, and the invention is not necessarily limited to having all the configurations described. A part of the configuration of a certain embodiment can be replaced with the configuration of another embodiment, and the configuration of another embodiment can be added to the configuration of a certain embodiment. It is possible to add, delete, and replace other configurations for a part of the configuration of each embodiment.

REFERENCE SIGNS LIST 1, 1A, 1B, 1C control system
2 multi-core system
3 lock-step core system
10, 11, 12, 13, 20, 21 core
50, 51, 52, 53, 60 memory
62, 63 FPGA (field programmable gate array)

200, 202 circuit generation device
201, 203 software generation device
260, 261 memory writer
290, 600 computer
291 display device
401, 450, 451, 452, 453 operation description
402 constraint condition
403 standard circuit description
404 degeneration circuit description
405 standard software description
406 degeneration software description
407 standard circuit result
408 degeneration circuit result
410 verification support information
470, 480, 490 window
481 menu button
482 menu window
500 vehicle
501 camera
502 steer
503 motor
504 front wheel
505 rear wheel
511 camera ECU
512 steer ECU
513 motor ECU
514 integrated ECU
601 controller
602, 603 programmable logic controller
604, 605 control device

The invention claimed is:

1. A circuit generation device or software generation device, which has a first operation synthesis function of generating a circuit description or a software description based on an operation description of a system, comprising:
a degeneration parameter extraction function of extracting a degeneration parameter from the operation description;
a degeneration parameter change function of changing a value of the degeneration parameter;
a second operation synthesis function of generating a degeneration circuit description or a degeneration software description based on the operation description and the value of the degeneration parameter; and
a determination function of determining whether performance of the degeneration circuit description or the degeneration software description satisfies a constraint condition based on the circuit description or the software description,
wherein, when the determination function determines that the degeneration circuit description or the degeneration software description does not satisfy the constraint condition, the degenerate parameter change function changes the value of the degenerate parameter and then executes the second operation synthesis function.

2. The circuit generation device or software generation device according to claim 1,
wherein the constraint condition includes at least one of an operation speed, a circuit area, and accuracy.

3. The circuit generation device or software generation device according to claim 1,
wherein the degeneration parameter extraction function has a function of reading the operation description line by line, and adding the degeneration parameter to a parameter list when the degeneration parameter is included before an end of the operation description is reached.

4. The circuit generation device or software generation device according to claim 1,
wherein the degeneration parameter changing function determines, when the performance of the degeneration circuit description or the degeneration software description does not satisfy the constraint condition, how much the performance deviates from the constraint condition, and when the performance of the degeneration circuit description or the degeneration software description does not satisfy the constraint condition and the deviation from the constraint condition is larger than a previous condition, the value of the degenerate parameter is returned to a previous value and a value of another degeneration parameter is changed, or the value of the other degeneration parameter is changed without returning the value of the degeneration parameter to the previous value.

5. The circuit generation device or software generation device according to claim 1, further comprising:
a degeneration pragma extraction function of extracting a degeneration pragma from the operation description,
wherein the second operation synthesis function is performed when the degeneration pragma is extracted from the operation description by the degeneration pragma extraction function.

6. The circuit generation device or software generation device according to claim 1, further comprising:
a verification support information generating function of generating verification support information of the degeneration circuit description or the degeneration software description after executing the determination function.

7. The circuit generation device or software generation device according to claim 1, further comprising:
a display device,
wherein the display device displays the constraint condition, the performance of the circuit description or the software description, and the performance of the degeneration circuit description or the degeneration software description.

* * * * *